United States Patent [19]

Kimura et al.

[11] Patent Number: 5,711,809
[45] Date of Patent: Jan. 27, 1998

[54] COATING APPARATUS AND METHOD OF CONTROLLING THE SAME

[75] Inventors: Yoshio Kimura; Satoshi Morita; Yuuji Matsuyama, all of Kumamoto-ken, Japan

[73] Assignee: Tokyo Electron Limited, Tokyo, Japan

[21] Appl. No.: 634,739

[22] Filed: Apr. 18, 1996

[30] Foreign Application Priority Data

Apr. 19, 1995 [JP] Japan .................................... 7-119335

[51] Int. Cl.$^6$ .................................................... B05C 5/00
[52] U.S. Cl. ..................... 118/663; 118/684; 118/52; 118/56; 118/603; 118/610; 118/319; 118/320; 118/326; 118/500; 118/501
[58] Field of Search ............................. 118/52, 56, 603, 118/610, 319, 320, 326, 500, 501, 663, 684; 427/345, 240; 134/186, 155, 902, 113

[56] References Cited

U.S. PATENT DOCUMENTS

| | | | |
|---|---|---|---|
| 4,967,782 | 11/1990 | Yamashita et al. | 427/345 |
| 5,358,740 | 10/1994 | Bornside et al. | 118/52 |
| 5,565,034 | 10/1996 | Nanbu et al. | 118/52 |

FOREIGN PATENT DOCUMENTS

| | | | |
|---|---|---|---|
| 2101732 | 4/1990 | Japan | 118/52 |
| 0216633 | 8/1990 | Japan | 118/52 |
| 5-121308 | 5/1993 | Japan . | |

*Primary Examiner*—Laura Edwards
*Attorney, Agent, or Firm*—Oblon, Spivak, McClelland, Maier & Neustadt, P.C.

[57] ABSTRACT

In the present invention, a waste solution and a exhaust gas are guided together from a drain cup DC into a storing means through common discharge means. Naturally, the gas-liquid separation is performed within the storing means in place of performing the gas-liquid separation within the drain cup DC. Therefore, the waste solution is not solidified within the drain cup so as to plug the common discharge means. Also, a predetermined waste solution is kept stored in the storing means included in the coating apparatus of the present invention, making it possible to permit the surface of the stored waste solution to absorb the mist, and the waste solution is prevented from being solidified within the storing means. Further, since a minimum amount of the exhaust gas is kept discharged even during non-operation of the coating apparatus by using an exhaust gas damper whose degree of opening can be controlled, the waste solution stored in the storing means is prevented from being solidified. Also, the waste solution evaporated within the storing means can be released to the outside.

14 Claims, 8 Drawing Sheets

COATING APPARATUS AND METHOD OF CONTROLLING THE SAME

BACKGROUND OF THE INVENTION

1. Field of the Invention

The present invention relates to a coating apparatus, particularly, to a spinner type coating apparatus in which a surface of an object to be coated, which is disposed on a spin chuck, is coated with a process solution.

2. Description of the Related Art

Figure 1:
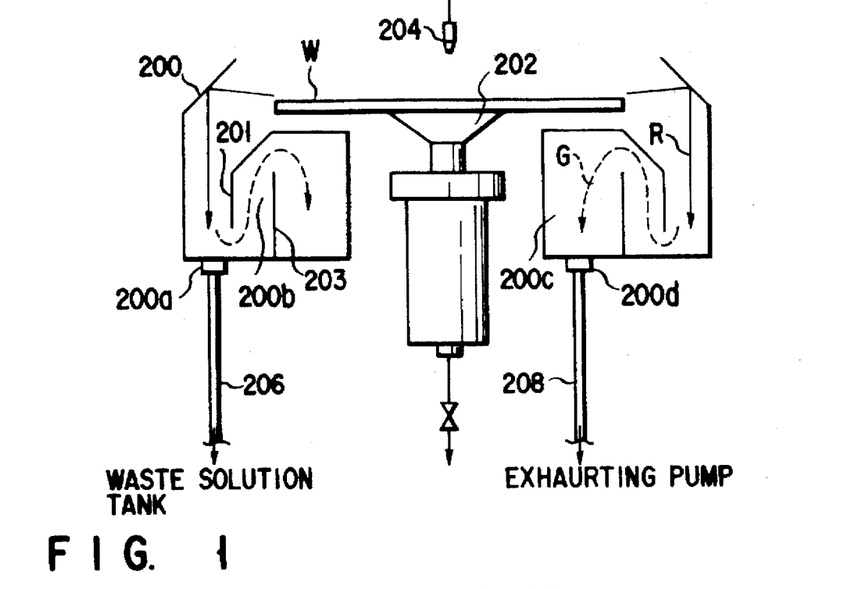
FIG. 1 is a cross sectional view schematically showing the construction of a conventional coating apparatus.

FIG. 1 shows a conventional resist coating apparatus. As seen from the drawing, the resist coating apparatus comprises an annular cup 200. A spin chuck 202 is arranged in the central portion within the annular cup 200. A semiconductor wafer W is disposed on the spin chuck 202. Under this condition, a resist solution is dripped through a resist nozzle 204 onto the surface of the semiconductor wafer W. During the dripping, the spin chuck 202 is rotated so as to rotate the semiconductor wafer W, with the result that the resist solution is centrifugally expanded such that the entire wafer surface is uniformly coated with the resist solution.

The resist solution scattered from the semiconductor wafer W during the resist coating step runs to impinge against an upper portion of the inner wall of the annular cup (drain cup) 200 and, then, is guided to the bottom of the cup 220, as denoted by a solid line R. Further, the scattered resist solution flows through a waste solution outlet port 200a and a pipe 206 into a waste solution tank (not shown). As seen from the drawing, a discharge path 200b of a labyrinth structure formed by an intermediate hanging wall 201 and an intermediate upright wall 203 is arranged within the cup 200. The discharge path 200b functions as a mist trap. To be more specific, mist which is converted into an exhaust gas is removed from the scattered resist solution within the discharge path 200b, as denoted by a solid line G, and, then, guided into a discharge chamber 200c on the side of the inner circumferential surface of the annular cup 200. Further, the mist guided into the discharge chamber 200c is further guided into an exhausting pump (not shown) through an outlet port 200d of the discharge chamber 200c and a pipe 208.

As described above, the conventional apparatus is constructed such that the scattered resist solution is separated within the drain cup 200 into the waste solution and the exhaust gas which are discharged through the outlet ports 200a and 200d, respectively, which are formed separately from each other. What should be noted is that the mist removed from the scattered resist solution, which is guided to the discharge path 200b together with the exhaust gas, is attached to the surfaces of the intermediate hanging wall 201 and the intermediate upright wall 203. Then, the mist attached to the wall surfaces is solidified after drying so as to cause plugging of the discharge path 200b acting as a mist trap. To prevent the plugging problem, required is a troublesome operation of frequently washing the discharge path 200b with a solvent such as a thinner.

Also, an on-off control alone is applied to the gas discharge system in the conventional apparatus. If a gas is kept discharged during the processing, the peripheral portion of an object to be processed is solidified relatively faster than the central portion, resulting in failure to form a film of a uniform thickness on the surface of the object. Further, if a gas is kept discharged during non-processing, a process solution such as a resist solution is dried and solidified in the gas discharge system, making it necessary to wash the apparatus before restarting of the processing. If a gas discharge is stopped during the non-processing, however, the gas discharge system is filled with an evaporated solvent, leading to generation of offensive odor. In addition, since the evaporated solvent tends to catch fire easily, it is necessary to pay careful attentions in restarting the processing. Particularly where it is necessary to stop operating the apparatus for a long period of time, the problems pointed out above are rendered more serious.

SUMMARY OF THE INVENTION

An object of the present invention, which has been achieved in view of the above-noted problems inherent in the prior art, is to provide a novel and improved coating apparatus which is effective for preventing a process solution within a drain cup for recovering the process solution scattered from an object to be processed from being evaporated to cause a plugging problem and which permits facilitating the maintenance operation.

Another object is to provide a novel and improved coating apparatus which permits controlling the gas discharge amount by employing a gas discharge damper, which is cheap and can be operated easily, so as to improve the uniformity in the thickness of the film formed on the object, and which is effective for preventing the process solution in the gas discharge system from being solidified and, at the same time, for preventing the gas discharge system from being filled with the evaporated process solution during non-processing of the object.

According to a first aspect of the present invention, there is provided a coating apparatus, comprising a container, a rotatable support plate arranged within the container and movable in a vertical direction, and film forming means for supplying a predetermined coating solution onto a surface of an object disposed on the rotatable support plate, which is kept rotated, fox forming a coating film on the surface of the object. The coating apparatus further comprises discharge means for discharging the coating solution together with an exhaust gas, the coating solution being scattered from the object and collected within the container, storing means for temporarily storing the waste solution coming from the discharge means, gas-liquid separating means for separating the waste solution within the storing means into a waste solution and an exhaust gas, and storing amount control means for controlling the storing amount of the waste solution to permit a predetermined amount of the waste solution to be stored in the storing means. The particular coating apparatus can be constructed such that the discharge means has an opening positioned higher than the surface of the waste solution stored in the maximum amount in the storing means, and that the gas-liquid separating means comprises a gas discharge port positioned higher than the opening of the discharge means and a waste solution discharge port positioned lower than the opening of the discharge means.

In the coating apparatus of the present invention, the gas-liquid separation is not performed within a drain cup. Specifically, the waste solution and exhaust gas are transferred from the drain cup into the storing means through the common discharge means. Also, separation into the waste solution and the exhaust gas is effected by the gas-liquid separating means within the storing means. It follows that the apparatus of the present invention makes it possible to eliminate the problem inherent in the prior art that the waste solution is solidified within the drain cup so as to bring about a plugging problem. It should also be noted that the storing means in the conventional apparatus is made vacant. However, a predetermined amount of the waste solution is kept stored in the storing means included in the coating apparatus of the present invention. It follows that a gas-liquid mixed stream is allowed to impinge against the surface of the waste solution stored in the storing means, making it possible to remove the mist effectively from the gas-liquid mixed stream. In addition, the waste solution can be prevented from being solidified within the storing means.

It is possible for the opening of the discharge means to be tapered. It is also possible for the opening of the discharge means to be constructed such that at least a part of the opening is in contact with the inner wall of the storing means, such that the discharge means is provided with a small piece which permits at least a part of the opening of the discharge means to communicate with the inner wall of the storing means, or such that the discharge means comprises a piece of strip extending to reach the surface of the waste solution stored in the storing means. Further, an eddy current generating means for generating an eddy current in the vicinity of the opening may be formed in the discharge means. The particular construction exemplified above makes it possible to store the waste solution in the storing means for the subsequent discharge operation while suppressing the mist generation.

According to a second aspect of the present invention, there is provided a coating apparatus, comprising a container, a rotatable support plate arranged within the container and movable in a vertical direction, film forming means for supplying a predetermined coating solution onto a surface of an object disposed on the rotatable support plate, which is kept rotated, for forming a coating film on the surface of the object, discharge means for discharging the coating solution together with an exhaust gas, the coating solution being scattered from the object and collected within the container, storing means for temporarily storing the waste solution coming from the discharge means, gas-liquid separating means for separating the waste solution within the storing means into a waste solution and an exhaust gas, and storing amount control means for controlling the storing amount of the waste solution to permit a predetermined amount of the waste solution to be stored in the storing means. The coating apparatus further comprises an exhaust gas damper arranged in an exhaust system for discharging the exhaust gas separated by the gas-liquid separating means. The discharge amount of the exhaust gas is controlled by controlling the degree of opening of the exhaust gas damper. In this embodiment, the gas discharge amount can be controlled by using an exhaust gas damper, which is cheap and can be operated easily, without using a costly flow rate control apparatus such as a mass flow controller.

According to still another aspect of the present invention, there is provided a method of controlling a coating apparatus, comprising a container, a rotatable support plate arranged within the container and movable in a vertical direction, film forming means for supplying a predetermined coating solution onto a surface of an object disposed on the rotatable support plate, which is kept rotated, for forming a coating film on the surface of the object, discharge means for discharging the coating solution together with an exhaust gas, the coating solution being scattered from the object and collected within the container, storing means for temporarily storing the waste solution coming from the discharge means, gas-liquid separating means for separating the waste solution within the storing means into a waste solution and an exhaust gas, storing amount control means for controlling the storing amount of the waste solution to permit a predetermined amount of the waste solution to be stored in the storing means, and an exhaust gas damper whose degree of opening can be controlled and which is arranged in an exhaust system for discharging the exhaust gas separated by the gas-liquid separating means.

In controlling the exhaust gas discharge amount from the coating apparatus during non-processing of the object, the degree of opening of the exhaust gas damper is decreased so as to permit the exhaust gas to be discharged at a low flow rate, though the waste solution and the solvent stored in the storing means are prevented by the exhaust gas flow from being solidified. In the particular construction, a minimum amount of the exhaust gas is kept discharged even during non-operation of the apparatus, with the result that the evaporated waste solution and solvent are prevented from staying within the storing means. It follows that it is possible to prevent generation of an offensive odor and to suppress the danger of fire-catching. Further, since the waste solution and solvent are not solidified even if the exhaust gas is being discharged, the apparatus need not be washed and can be operated again promptly.

It should also be noted that, in determining the thickness of the film coated on the surface of the object, the degree of opening of the exhaust gas damper is set small so as to decrease the discharge rate of the exhaust gas. Since the exhaust gas is kept discharged even in the stage of determining the thickness of the coated film, it is possible to moderate the phenomenon that the coating solution in the peripheral portion of the object is solidified faster than that in the central portion. It follows that it is possible to make the film coated on the object uniform over the entire region of the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 2:
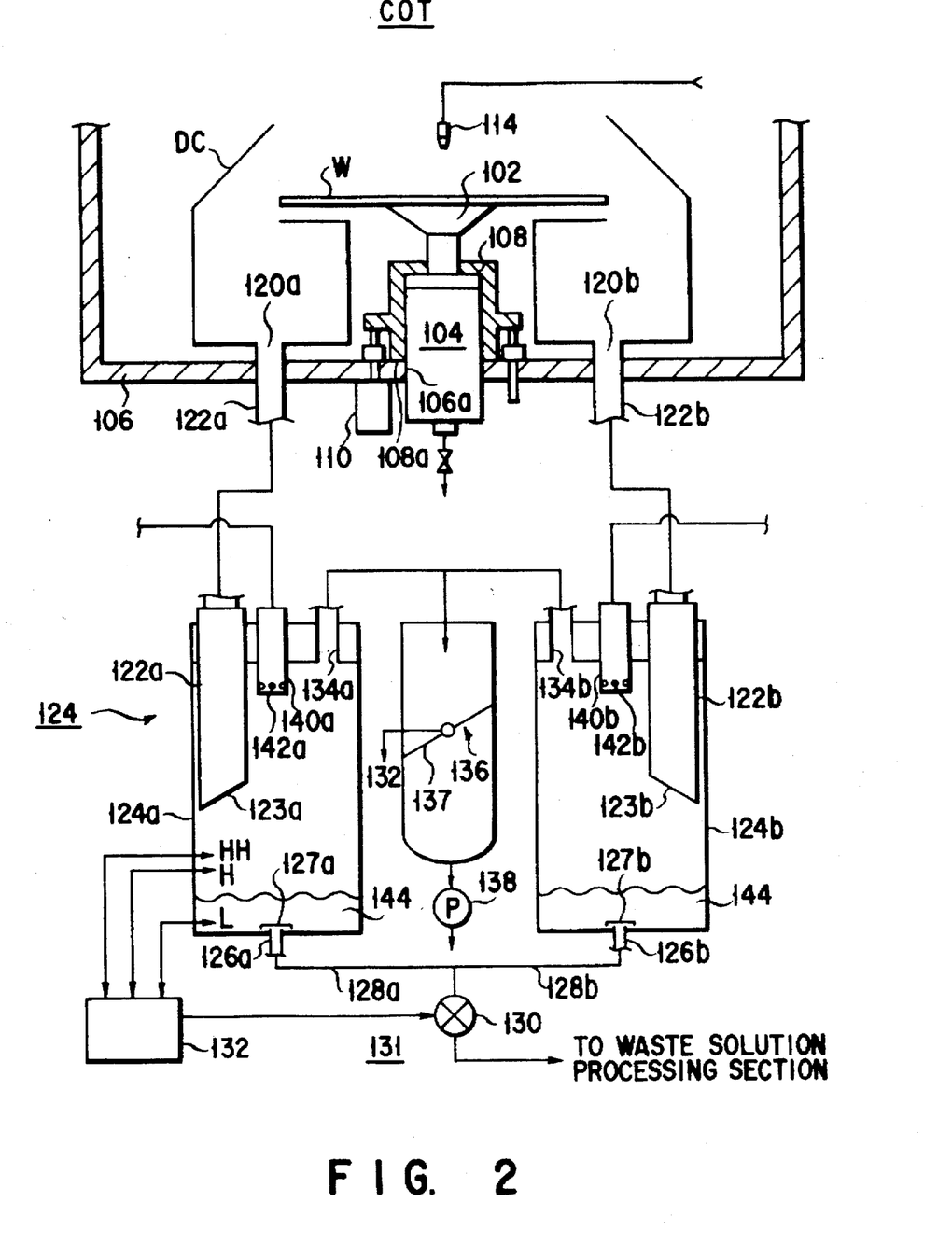
FIG. 2 schematically shows the construction of a coating apparatus according to one embodiment of the present invention.

Let us describe a coating apparatus according to a suitable embodiment of the present invention with reference to the accompanying drawings. Specifically, FIG. 2 schematically shows the construction of a resist coating unit (COT) having a coating apparatus of the present invention incorporated therein. In the resist coating unit (COT) shown in FIG. 2, an annular drain cup DC functioning as a drain cup is arranged in a central portion at the bottom of the unit, and a spin chuck 102 is arranged inside the annular drain cup DC. The spin chuck 102 having a semiconductor wafer W held stationary thereon by means of vacuum suction can be rotated by a driving motor 104 disposed on a bottom plate 106 of the resist coating unit. The driving motor 104 is arranged movable in a vertical direction. To be more specific, the driving motor 104 is connected to a lift mechanism 110 consisting of, for example, an air cylinder, and a vertical guide means 112 via a cap-like flange member 108 made of, for example, aluminum.

In the resist coating step, a lower end 108a of the flange member 108 is brought into tight contact with the unit bottom plate 106 in the vicinity of the outer circumferential region of an opening 106a so as to hermetically seal the inner region of the unit. When the semiconductor wafer W is transferred from the spin chuck 102 into a wafer transfer mechanism (not shown), the vertical driving means 110 serves to move upward the driving motor 104 or the spin chuck 102, with the result that the lower end of the flange member 108 is caused to float from the unit bottom plate 106.

A coating solution supply nozzle 114 is arranged right above the central portion of the semiconductor wafer W disposed on the spin chuck 102. The nozzle 114 is connected to a tank (not shown). In performing a coating operation, the nozzle 114 serves to take a predetermined amount of a coating solution, e.g., a resist solution containing a solvent such as a thinner, out of the tank so as to drip the coating solution onto substantially the central portion of the semiconductor wafer W.

Figure 3:
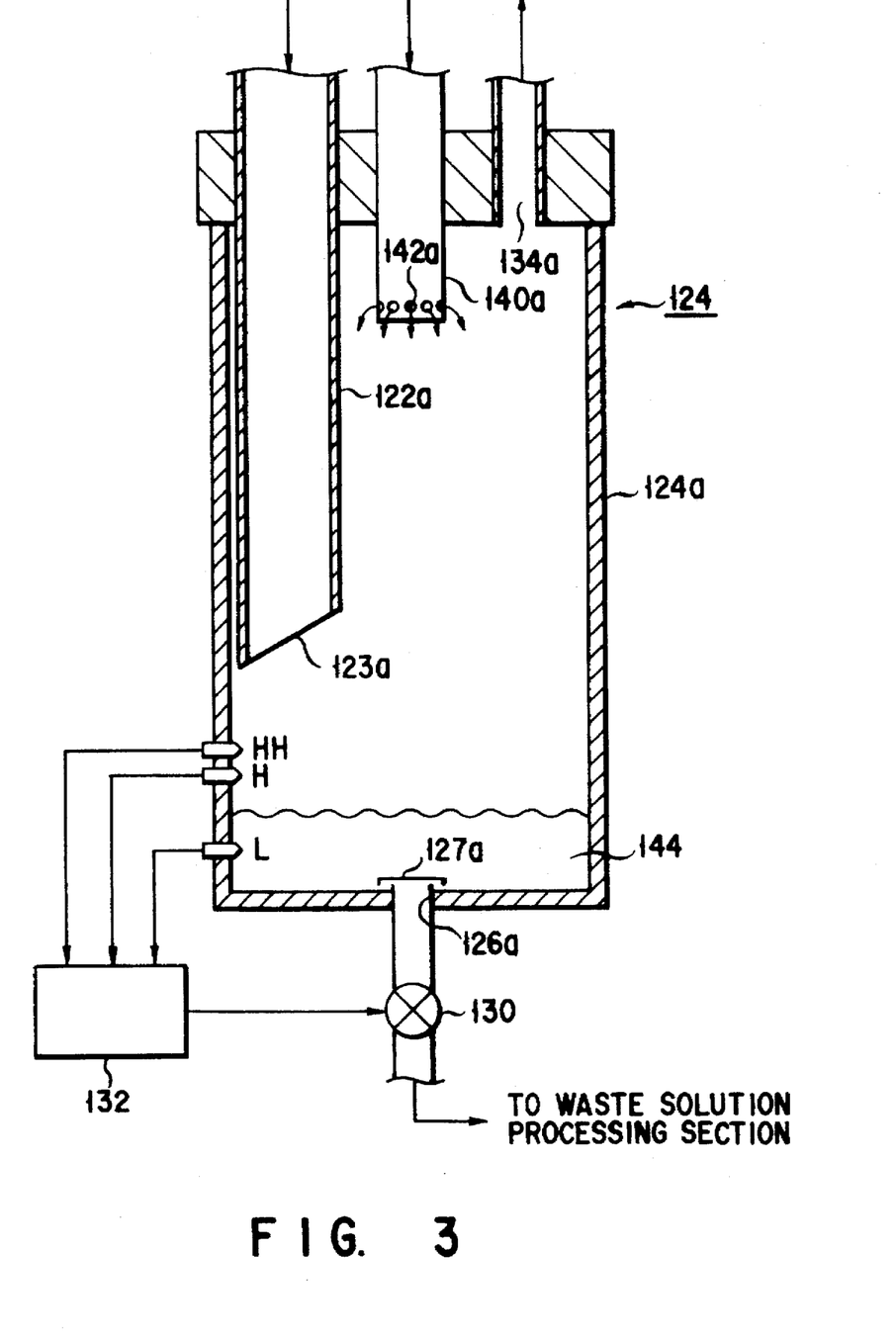
FIG. 3 is a cross sectional view schematically showing the construction of a waste solution storing tank which can be used in the coating apparatus of the present invention.

A chamber is defined by the outer circumferential wall, the inner circumferential wall and the bottom plate of the annular drain cup DC. Two drain ports 120a and 120b are formed through the bottom plate of the chamber thus defined. Needless to say, it suffices to form a single drain port, or three or more drain ports may be formed, if necessary, though two drain ports are formed in the embodiment shown in FIG. 2. These drains ports 120a, 120b are connected to a storing means 124 consisting of tanks 124a, 124b, etc. and serving to temporarily store the waste solution via a discharge means consisting of drain pipes 122a, 122b, etc. As shown in FIG. 3, lower end portions 122c, 122d of these drain pipes 122a, 122b extend to reach intermediate portions of the tanks 124a, 124b, respectively, such that the waste resist solutions are dripped from the tip portions of the drain pipes onto the surface of the waste solution (resist solution) or solvent 144, hereinafter referred to as a stored solution, stored in the tanks 124a, 124b.

As shown in FIG. 3, lower end portions 123a, 123b of these drain pipes 122a, 122b, which protrude into the tanks 124a, 124b, are tapered so as to permit the waste solution to be dripped satisfactorily into the tanks 124a, 124b, respectively. Incidentally, the tanks 124a, 124b have exactly the same construction. Therefore, the tapered end portion 123a alone included in the tank 124a is shown in FIG. 3. As shown in a magnified fashion, the tanks 124a, 124b form closed containers with waste solution outlet ports 126a, 126b formed through the bottom plates. These waste solution outlet ports 126a, 126b are connected to a discharge system 131 consisting of pipes 128a, 128b, a valve 130, and a waste solution process section (not shown), etc. In the embodiment shown in the drawings, the storing means of the waste solution is shown to include the two tanks 124a, 124b alone. However, it is also possible to provide separately a waste solution storing tank of a larger capacity downstream of these tanks 124a, 124b. In this case, these tanks 124a, 124b constitute intermediate tanks.

Further, lids 127a, 127b, each comprising a ceiling portion made of a blind plate and a circumferential side wall provided with a large number of holes, are mounted to cover the waste solution discharge ports 126a, 126b, respectively. It should be noted that, if the object, i.e., the semiconductor wafer W, is broken by some causes, it is possible for the broken pieces to fall through the drain pipes 122a, 122b into the tanks 124a, 124b. In embodiment of the present invention shown in FIGS. 2 and 3, however, these broken pieces of the semiconductor wafer W do not fall into the waste solution pipes 128a, 128b, because the lids 127a, 127b are mounted to cover the waste solution discharge ports 126a, 126b, respectively.

Liquid surface sensors HH, H and L are mounted at different heights within each of the tanks 124a, 124b so as to detect the surface of the waste solution stored in each of these tanks, as shown in FIG. 3. Each of these liquid surface sensors HH, H and L is connected to a controller 132. Upon receipt of the signal generated from any of these sensors HH, H and L, the controller 132 serves to open or close the valve 130 acting as a control means for controlling the amount of the waste solution stored in the tanks 124a, 124b. As a result, the surface of the waste solution stored in the tanks 124a, 124b is controlled to permit a predetermined amount of the waste solution to be kept stored in these tanks such that the waste solution surface within these tanks is not lowered below the level of the liquid surface sensor L. The level of the liquid surface within the tanks 124a, 124b should be determined appropriately in view of, for example, the kind of the resist solution, the exhaust gas discharge rate, etc. so as to achieve an optimum gas-liquid separation. Incidentally, the liquid surface sensor HH is intended to prevent an overflow. For example, the control system is constructed such that, when the surface of the stored waste solution is positioned higher than the level of the sensor HH, the operation of the coating apparatus is stopped until the surface of the stored waste solution is lowered to an normal level.

Exhaust gas discharge ports 134a, 134b are formed through the ceiling plates of the tanks 124a, 124b, respectively. These exhaust gas discharge ports 134a, 134b are connected through an exhaust gas damper 136, which is described later, to an exhaust gas discharge system comprising an exhaust gas discharge pump 138, etc. The exhaust gas separated from the gas-liquid mixed stream guided into the tanks 124a, 124b through the drain pipes 122a, 122b can be released to the outside through these exhaust gas discharge ports 134a, 134b. Incidentally, it is possible to mount a replaceable mist trap such as a mesh filter in the exhaust gas discharge pipes 134a, 134b so as to prevent the mist from flowing into the exhaust gas discharge pump, though the mist trap is not shown in the drawings.

In the embodiment shown in FIGS. 2 and 3, washing mechanisms 140a, 140b for spraying a solvent such as a thinner are mounted in upper portions of the tanks 124a, 124b. As apparent from FIG. 3, each of these washing mechanisms 140a, 140b is in the form of a nozzle having a large number of holes 142a, 142b formed in the tip portions. Of course, a solvent is sprayed through these holes, as desired, so as to remove the waste resist solution, etc. which is solidified within the tanks 124a, 124b. These washing mechanisms 140a, 140b are also used for supplying a solvent into the tanks 124a, 124b in the case where the amount of the waste solution stored in these tanks is decreased to a level lower than the desired amount, or where an alarm is generated from the liquid surface sensor L.

Figure 4:
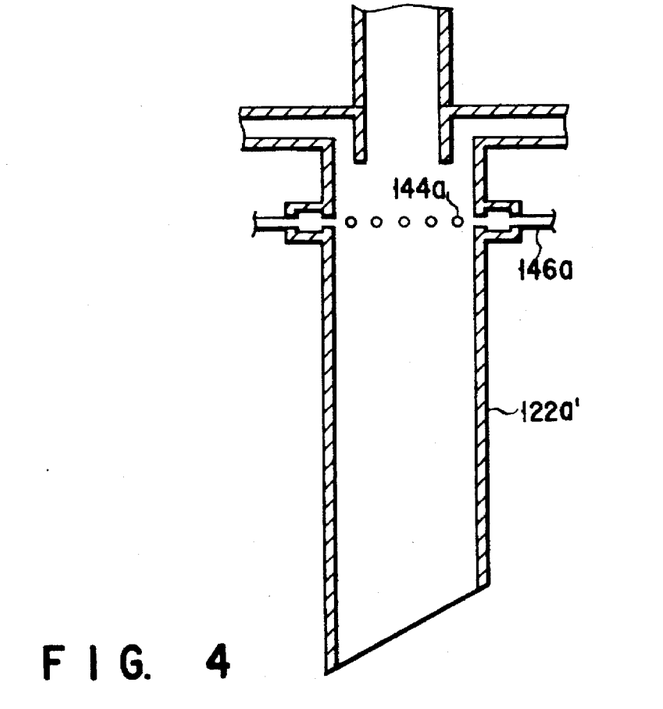
FIG. 4 is a cross sectional view schematically showing the construction of a drain pipe which can be used in the coating apparatus of the present invention.

FIG. 4 shows a drain pipe 122a' as a measure for washing the drain pipes 122a, 122b. Specifically, a large number of solvent spraying holes 144a are formed in an upper portion of the drain pipe 122a such that these holes are positioned to face the inner region of the drain pipe 122a. In this embodiment, a solvent such as a thinner, which is supplied through a solvent supply system 146a, is sprayed through these solvent spraying holes 144a into the inner region of the drain pipe for the washing purpose. Of course, the solvent supply system 146a mounted to the drain pipe 122a' can also be used, like the washing mechanism 142a described previously, for supplying a solvent into the tanks 124a, 124b in the case where the amount of the waste solution stored in these tanks is decreased to a level lower than the desired amount, or where an alarm is generated from the liquid surface sensor L.

The exhaust gas discharge ports 134a, 134b are positioned higher than the open lower ends 123a, 123b of the drain pipes 122a, 122b, as shown in FIG. 3. As a result, the gaseous component alone separated from the gas-liquid mixed stream introduced into the tanks 124a, 124b through the drain pipes 122a, 122b can be selectively released to the outside through the exhaust gas discharge ports 134a, 134b and the exhaust gas discharge system. On the other hand, the waste solution discharge ports 126a, 126b of the tanks 124a, 124b are positioned lower than the open lower ends 123a, 123b of the drain pipes 122a, 122b, as already described. It follows that the waste solution alone separated from the gas-liquid mixed stream introduced into the tanks 124a, 124b through the drain pipes 122a, 122b can be selectively discharged to the outside through the waste solution discharge ports 126a, 126b and the waste solution discharge system 131.

As described above, the gas-liquid mixed stream is effectively separated into the gaseous portion and the liquid portion within the tanks 124a, 124b and, then, these separated gaseous portion and liquid portion are discharged to the outside through the exhaust gas discharge system and the waste solution discharge system 131, respectively, which are formed separately from each other.

It should be noted that a waste solution continuously flows through the drain pipes 122a, 122b into the tanks 124a, 124b having a predetermined amount of solution stored therein, with the result that the waste solution is prevented from being solidified within these tanks. It should also be noted that the mist-like droplets formed in the flowing process of the waste solution from the drain pipes 122a, 122b into the tanks 124a, 124b collide against the surface of the waste solution stored in the tanks 124a, 124b so as to be collapsed and separated into the gaseous portion and liquid portion. In short, the mist is also separated into the gaseous portion and the liquid portion. Further, it is also possible to provide a heater or a heating device utilizing, for example, a temperature-controlled liquid, for heating the waste solution stored in the tanks 124a, 124b so as to lower the viscosity of the waste solution and, thus, to prevent effectively the waste solution from being solidified.

Figure 5A:
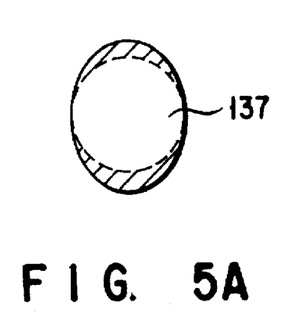
FIG. 5A is a plan view schematically showing an air flow restricting member included in an exhaust gas damper which can be used in the coating apparatus according to one embodiment of the present invention.
Figure 5B:
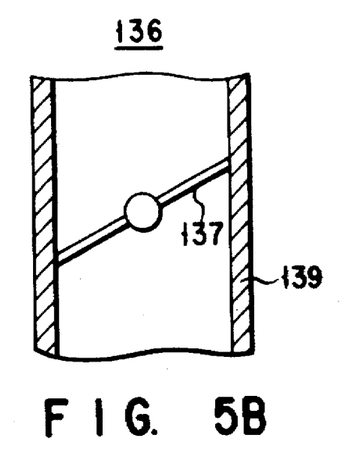
FIG. 5B is a cross sectional view schematically showing the construction of an exhaust gas damper which can be used in the coating apparatus according to one embodiment of the present invention.

Let us describe the exhaust gas discharge system included in the coating apparatus of the present invention, with reference to FIGS. 2 and 5. As shown in detail in FIGS 5A and 5B, disposed is an exhaust gas damper 136 comprising an elliptical air flow restricting member 137 arranged within an exhaust gas discharge pipe 139. The air flow within the pipe 139 is inhibited in the case where the air flow restricting member 137 acting as a valve is positioned as shown in FIG. 5B, and the air flow rate within the pipe 139 depends on the degree of opening of the valve, i.e., the position of the air flow restricting member 137. Upon receipt of a signal generated from the controller 132, the exhaust gas damper 136 permits controlling the degree of opening of the air stream restricting member 137 over the entire region including the completely closed position as shown in FIG. 5B and the completely open position in which the air flow restricting member 137 extends along the axis of the pipe 139. In this embodiment, the air flow restricting member 137 is elliptical as shown in FIG. 5A. Therefore, when the air flow restricting member 137 abuts against the inner surface of the exhaust gas discharge pipe 139 to stop completely the air flow within the pipe 139, the air flow restricting member 137 is inclined relative to the air flow direction, as shown in FIG. 5B. As apparent from FIG. 5B, the particular construction permits improving the air-tightness achieved by the air flow restricting member 137, compared with the conventional exhaust gas damper constructed such that the air flow control member extends in a direction perpendicular to the air flowing direction within the pipe for completely inhibiting the air flow within the pipe.

Figures 6, 8:
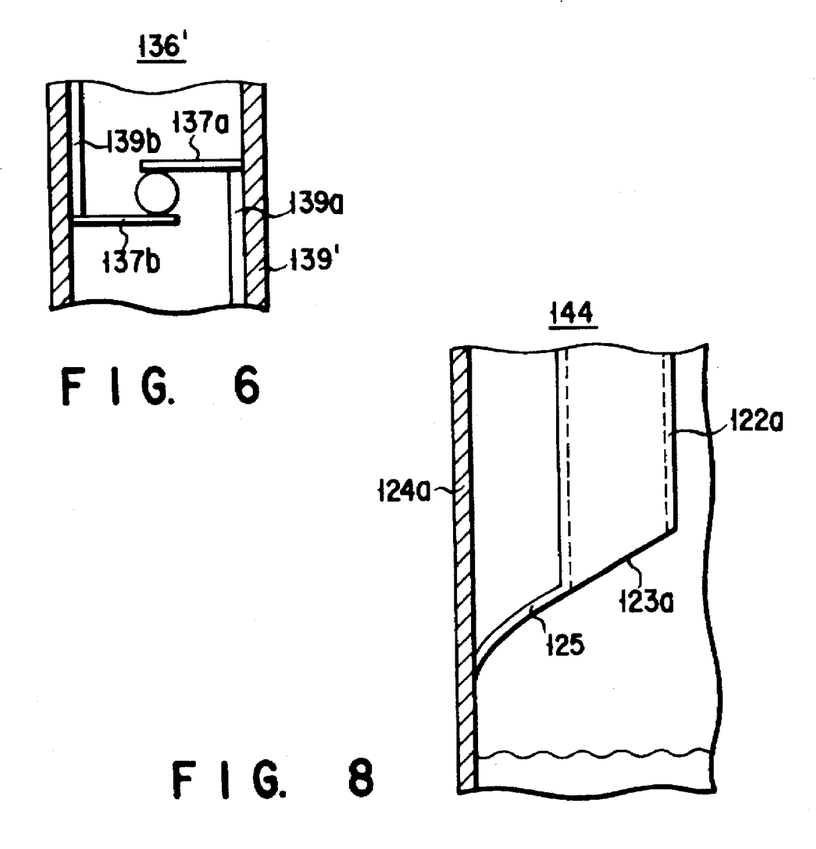
FIG. 6 is a cross sectional view schematically showing the construction of an exhaust gas damper which can be used in the coating apparatus according to another embodiment of the present invention.
FIG. 8 is a cross sectional view schematically showing the construction of a drain pipe which can be used in the coating apparatus according to another embodiment of the present invention.

It is also possible to use an exhaust gas damper 136' constructed as shown in, for example, FIG. 6 in place of the damper 136 shown in FIG. 5. The exhaust gas damper 136' shown in FIG. 6 comprises two air flow restricting vanes 137a, 137b arranged at different heights and stepped portions 139a, 139b formed along the inner surface of an exhaust gas discharge pipe 139' When the damper 136' is positioned to inhibit completely the air flow within the pipe 139', the tips of the vanes 137a, 137b are allowed to rest on these stepped portions 139a, 139b, respectively. As apparent from the drawing, the particular construction also permits improving the air-tightness when the exhaust gas damper 136' is positioned to inhibit completely the air flow within the pipe 139'.

Since the exhaust gas damper which can be used in the coating apparatus of the present invention is constructed as described above, the coating apparatus of the present invention can be operated in a plurality of different modes without using a costly apparatus such as a mass flow controller, as described below.

(a) Idling Mode

In the coating apparatus of the present invention, a predetermined amount of the waste solution 144 is kept stored in each of the tanks 124a, 124b. However, where the coating apparatus is not operated over a long period of time because of, for example, a long vacation, the coating apparatus can be driven in an idling mode. During the driving in an idling mode, the exhaust gas damper 136 is controlled to permit the exhaust gas to flow through the pipe 139 at a very low flow rate, as far as the waste solution 144 stored in the tanks 124a, 124b is prevented from being dried and solidified. The degree of opening of the exhaust gas damper 136 can be determined appropriately in view of the capacity of the tanks 124a, 124b, the kind of the waste solution 144, the period of non-operation of the coating apparatus, etc. The driving in the idling mode described above is effective for preventing the waste solution 144 from being evaporated to stay within the tanks 124a, 124b. Also, since the exhaust gas is released from within these tanks in a very low flow rate during the driving in the idling mode, the waste solution 144 within these tanks is also prevented from being solidified. Incidentally, where the amount of the waste solution 144 stored in the tanks 124a, 124b is decreased to a level lower than the predetermined amount during non-operation of the coating apparatus over a long period of time, a suitable solvent can be supplied into the tanks 124a, 124b through the washing mechanism 142a.

(b) Film Thickness Control Mode

If the exhaust gas is kept discharged by the ordinary discharge mode during the coating operation, the coating solution dripped from the nozzle 114 is dried in the peripheral portion of the wafer W faster than the central portion, as already described, with the result that the film coated on the wafer W tends to be nonuniform. The peripheral portion of the wafer W is dried faster because the peripheral portion is positioned closer to the drain ports 120a, 120b than the central portion. To overcome the difficulty, the degree of opening of the exhaust gas damper 136 is temporarily diminished after dripping of the coating solution so as to decrease the discharge rate of the exhaust gas. As a result, the coating solution distributed over the entire region of the wafer W can be dried uniformly so as to make the thickness of the film formed on the wafer W uniform over the entire region of the wafer W. After the thickness of the coated film has been determined, the exhaust gas damper 136 is opened again to perform the ordinary exhaust gas discharge operation. Incidentally, the operating time for the film thickness control mode in which the degree of opening of the exhaust gas damper 136 is temporarily diminished and the exhaust gas discharge rate in the film thickness control mode can be determined appropriately in view of the amount of the coating solution dripped from the nozzle 114, the size of the object (semiconductor wafer W), the capacity of the exhaust gas discharge system, etc.

The coating apparatus of the present invention constructed as described above is operated as described in the following. In the first step, the spin chuck 102 is moved upward from the annular drain cup DC by the lift mechanism 110 so as to receive an object, e.g., semiconductor wafer W, from a transfer arm (not shown). The wafer W is held stationary on the spin chuck 102 by means of vacuum suction. Then, the spin chuck 102 is moved downward so as to be in direct contact with the bottom plate 106 of the resist coating unit (COT). Under this condition, a predetermined amount of a resist solution, i.e., a coating solution, is dripped from the nozzle 114 onto the central portion of the semiconductor wafer W. During the dripping operation, the exhaust gas discharge system is operated in the ordinary discharge mode.

Then, the driving motor 104 is driven to impart a rotating force to the spin chuck 102, with the result that the resist solution dripped onto the semiconductor wafer W disposed on the spin chuck 102 is centrifugally spread over the entire surface of the wafer W so as to form a resist layer, i.e., coating film, having a predetermined thickness. In the coating apparatus of the present invention, the degree of opening of the exhaust gas damper 136 is controlled appropriately, and the exhaust gas discharge system is operated in a film thickness control mode, making it possible to form a resist layer of a uniform thickness. After formation of the resist layer, the exhaust gas discharge system is operated again in the ordinary discharge mode. Then, rotation of the spin chuck 102 is stopped, and the spin chuck 102 is moved upward again by the lift mechanism 110 so as to transfer the treated wafer W onto the transfer arm (not shown), followed by receiving a new wafer W from the transfer arm.

The waste resist solution centrifugally scattered from the wafer W during the coating operation is received by the annular drain cup DC in the form of droplets or mist and, then, transferred by the exhaust gas stream formed within the drain cup DC so as to be collected in the bottom portion of the resist coating unit. The droplets and mist introduced into the annular drain cup DC are mixed with the air introduced from the outside and with the solvent of the resist solution evaporated within the drain cup DC so as to form a gas-liquid mixed stream. The gas-liquid mixed stream is guided into the tanks 124a, 124b through the drain ports 120a, 120b and the drain pipes 122a, 122b. In the coating apparatus of the present invention, the waste solution is prevented from being solidified within the tanks 124a, 124b because the gas-liquid mixed stream is continuously guided into the tanks 124a, 124b through the drain pipes 122a, 122b, respectively. Further, the mist-like droplets, which are formed when the gas-liquid mixed stream is introduced through the drain pipes 122a, 122b into the tanks 124a, 124b, collide against the surface of the waste solution stored in the tanks 124a, 124b so as to be collapsed and separated into the gaseous component and liquid component. In this fashion, the waste solution including the mist, which form a gas-liquid mixed stream, can be effectively separated into the gaseous component and liquid component. The waste solution, i.e., liquid component, separated from the gas-liquid mixed stream is released from the waste solution outlet ports 126a, 126b into a waste solution processing section through the waste solution discharge system 131. On the other hand, the exhaust gas, i.e., the gaseous component, separated from the gas-liquid mixed stream is released from the exhaust gas outlet ports 134a, 134b to the outside through the exhaust gas discharge system.

As already described, the coating apparatus of the present invention can be driven in an idling mode so as to release the exhaust gas to the outside in a very low flow rate when operation of the apparatus is stopped over a long period of time because of, for example, a long vacation. It should be noted in this connection that the waste solution 144 stored in the tanks 124a, 124b tends to be evaporated during non-operation of the coating apparatus. However, the driving in the idling mode makes it possible to prevent the evaporated waste solution 144 from staying within these tanks. Also, since the exhaust gas is released from these tanks in a very low rate, the waste solution 144 is prevented from being solidified within these tanks 124a, 124b.

Figure 7:
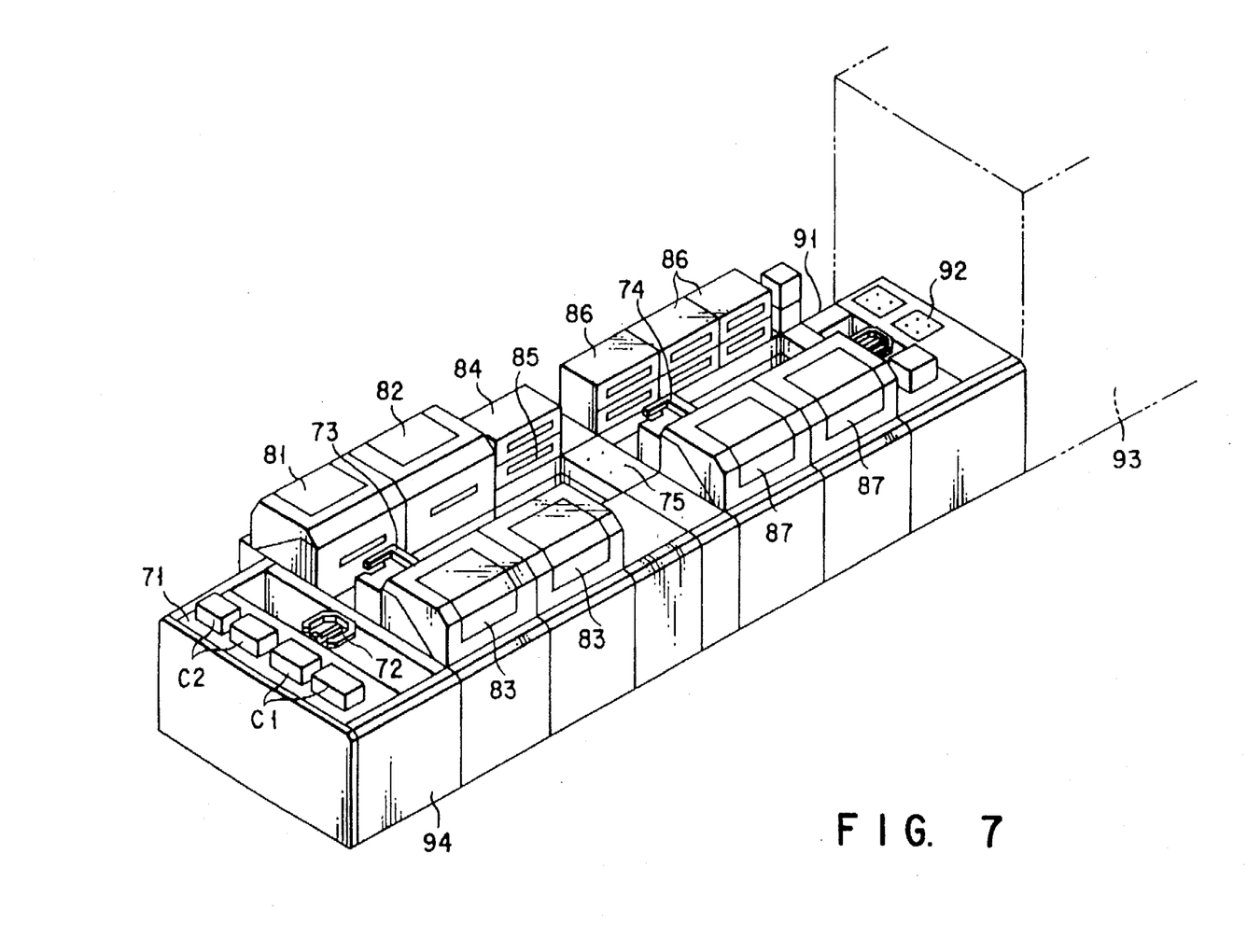
FIG. 7 is an oblique view schematically showing the construction of a coating-developing apparatus having a coating apparatus of the present invention incorporated therein.

The coating apparatus of the present invention, which can be used independently, can also be used in combination with, for example, a coating-developing apparatus for an LCD substrate, as shown in FIG. 7. As shown in FIG. 7, a carrier C1 having a plurality of non-treated wafers housed therein and another carrier C2 having a plurality of treated wafers housed therein are mounted on a carrier stage 71. The system shown in FIG. 7 also comprises a pincette 72, main arms 73, 74 for transferring substrates, and a delivery counter 75. Further, arranged on both sides of the main arm 73 or 74 are a brush-washing section 81, a jet water washing section 82, a coating device 83, an adhesion treating section 84, a cooling section 85, a heat treating section 86 and a developing section 87. Still further, an exposure apparatus 93 is joined to the right end of the coating-developing apparatus with another pincette 91 and another delivery counter 92 interposed therebetween.

In the coating-developing apparatus of the construction described above, the non-treated substrates housed in the cassette (carrier) C1 are taken out by the pincette 72 and, then, transferred onto the main arm 73 so as to be transferred into the brush-washing section 81. The substrates subjected to the brush washing within the brush-washing section 81 are introduced, as desired, into the jet water-washing section 82 so as to be washed with a high pressure jet water stream. After the washing step, a treatment to make the substrate hydrophobic is applied to the substrate within the adhesion treating section 84, followed by cooling in the cooling section 85. Further, a photoresist film, which is sensitive to light, is formed by means of coating on the substrate in the coating apparatus 83. The substrate having a photoresist film formed thereon is selectively exposed to light in the exposure apparatus 93 and, then, developed in the developing section 87.

Figure 9:
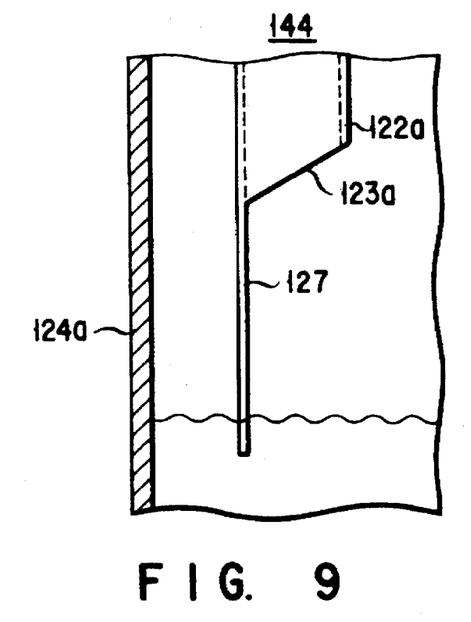
FIG. 9 is a cross sectional view schematically showing the construction of a drain pipe which can be used in the coating apparatus according to another embodiment of the present invention.
Figure 10:
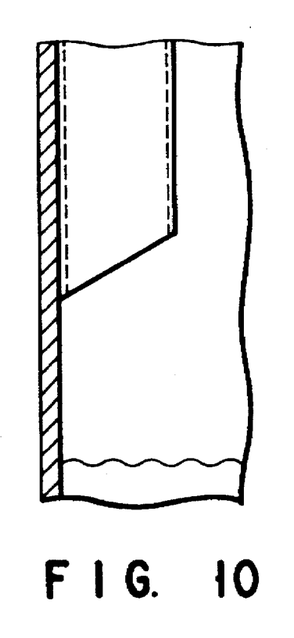
FIG. 10 is a cross sectional view schematically showing the construction of a drain pipe which can be used in the coating apparatus according to another embodiment of the present invention.

The accompanying drawings simply show preferred embodiments of the present invention and do not limit the technical scope of the present invention. In other words, it is of no difficulty for those skilled in the art to modify the coating apparatus of the present invention described above in various fashions within the technical scope of the present invention. For example, the lower open end portions 123a, 123b of the drain pipes 122a, 122b are simply tapered in the embodiment described above, as apparent from, for example, FIG. 3. However, it is also possible to employ various measures as shown in FIGS. 8 to 10. Specifically, FIG. 8 shows that a small piece 125 is mounted to connect the tip portion of the open end portion 123a to the inner surface of the tank 124a. FIG. 9 shows that a strip piece 127 is mounted to the tip portion of the open end portion 123a such that the strip piece 127 extends to reach the surface of the waste solution 144 stored in the tank 124a. Further, FIG. 10 shows that the inner surface of the tank 124a or 124b constitutes a part of the open end portion 123a or 123b of the drain pipe 122a or 122b. In this case, the gas-liquid mixed stream flowing within the drain pipe can be continuously guided smoothly into the waste solution 144 stored in the tank.

Figure 11:
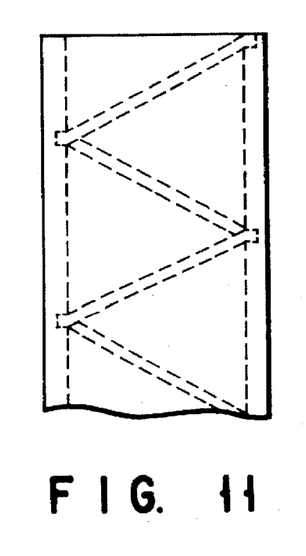
FIG. 11 is a cross sectional view schematically showing the construction of an eddy current generating means which can be used in the coating apparatus according to another embodiment of the present invention.
Figure 12A:
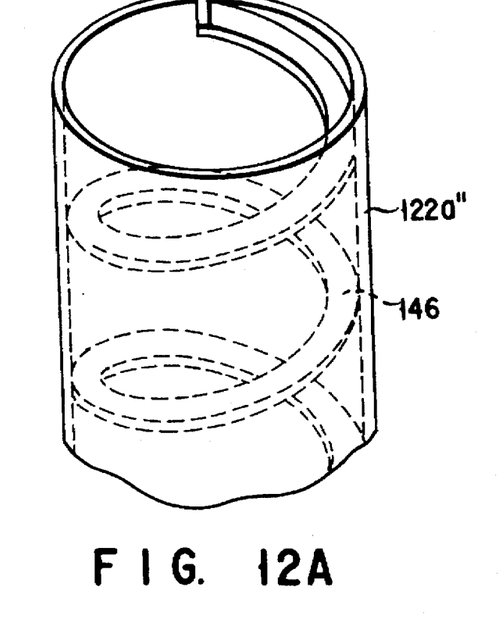
FIG. 12A is a perspective view showing how to use an eddy current generating means according to another embodiment of the present invention in a coating apparatus of the present invention.
Figure 12B:
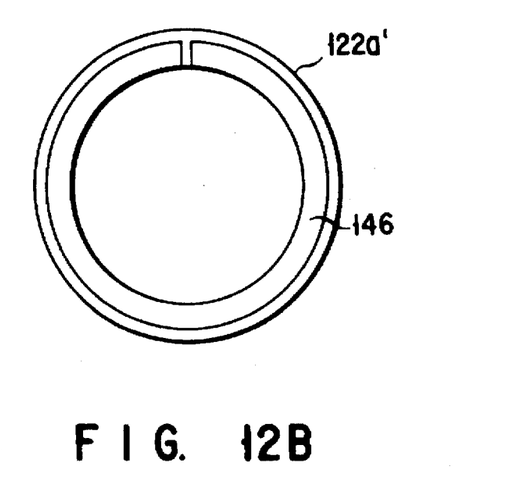
FIG. 12B is a plan view showing how to use an eddy current generating means according to another embodiment of the present invention in a coating apparatus of the present invention.
Figure 13A:
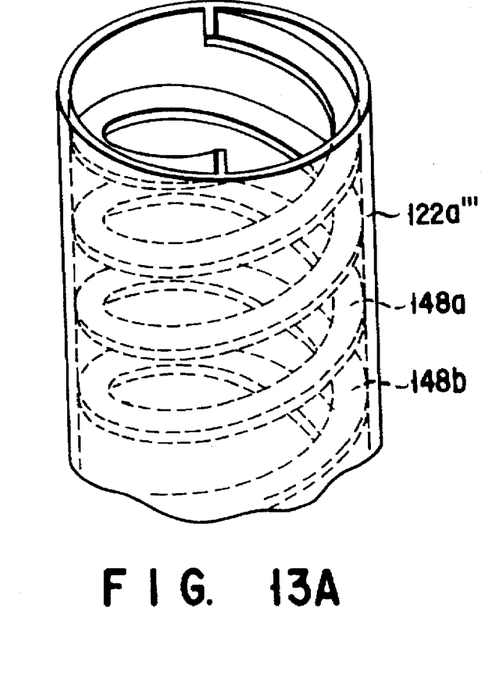
FIG. 13A is a perspective view showing how to use an eddy current generating means according to another embodiment of the present invention in a coating apparatus of the present invention.
Figure 13B:
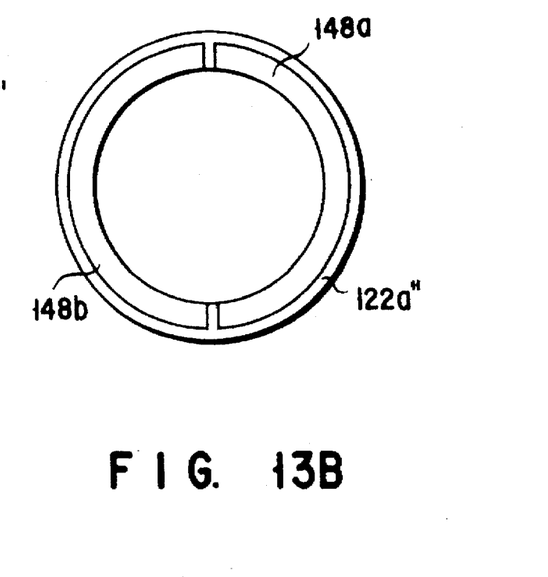
FIG. 13B is a plan view showing how to use an eddy current generating means according to another embodiment of the present invention in a coating apparatus of the present invention.

FIGS. 11 to 13 show additional modifications in respect of the construction of the lower open end portions 123a, 123b of the drain pipes 122a, 122b. In these modifications, a spiral groove 140 or a spiral projection is formed in the inner surface of each of the drain pipes 122a, 122b in the lower open end portions positioned within the tanks 124a, 124b.

Specifically, in the embodiment shown in FIG. 11, the spiral groove 140 is formed in the inner surface of the drain pipe 122a' in the lower open end portion positioned within the tank (not shown). The gas-liquid mixed stream flowing through the drain port 120a of the drain cup DC flows along the spiral groove 140 so as to form an eddy current. Where the gas-liquid mixed stream flows within the lower end portion of the drain pipe in the form of an eddy current, the waste solution is unlikely to stay within the drain pipe 122a', making it possible to prevent the drain pipe 122a' from being plugged. It is also possible to allow the gas-liquid mixed stream to collide smoothly and without fail against the surface of the waste solution stored in the tanks 124a, 124b. As a result, the separation of the mist into the gaseous component and the liquid component is promoted on the surface of the waste solution. In addition, since the surface of the waste solution is waved by the collision, the waste solution is prevented from being solidified within the tanks 124a, 124b. What should also be noted is that the gas-liquid separation can be performed to some extent within the drain pipe 122a' by the centrifugal force produced by the eddy current. Incidentally, the spiral groove 140 in the inner surface of the drain pipe 122a' may be formed in only the lower open end portion as shown in the drawings or over the entire length of the drain pipe 122a'. Where the spiral groove is formed in only the lower open end portion, it is possible to form separately the lower end portion of the drain pipe having the spiral groove 140 formed in the inner surface. In this case, the lower open end portion thus formed is attached by using a suitable joint to the body of the drain pipe.

Figure 14A:
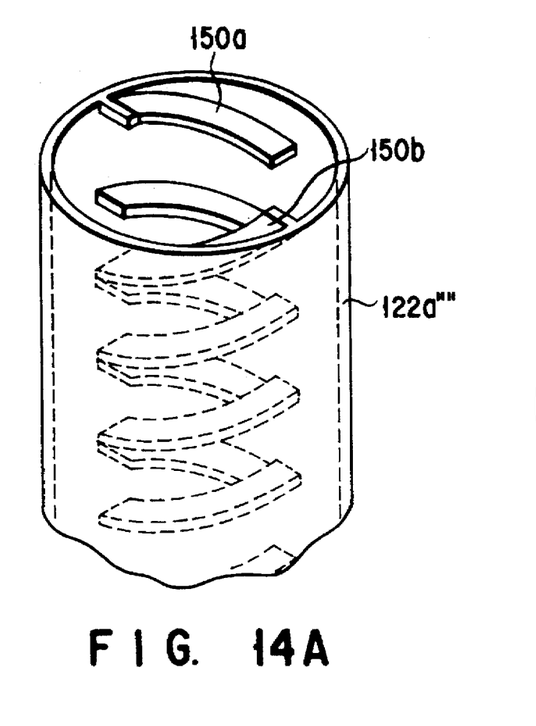
FIG. 14A is a perspective view showing how to use an eddy current generating means according to still another embodiment of the present invention in a coating apparatus of the present invention.
Figure 14B:
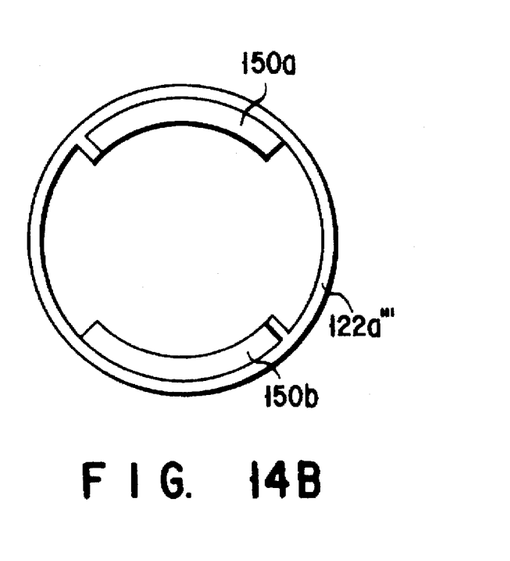
FIG. 14B is a plan view showing how to use an eddy current generating means according to still another embodiment of the present invention in a coating apparatus of the present invention.
Figure 15:
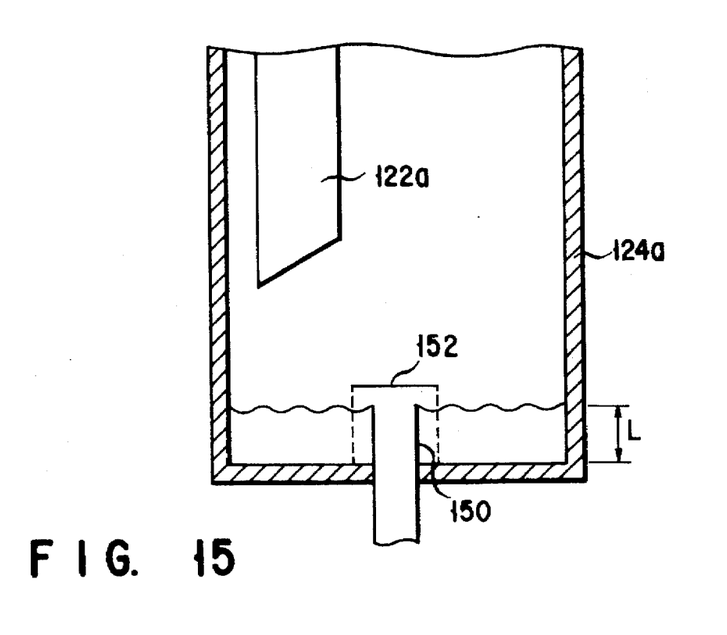
FIG. 15 is a cross sectional view schematically showing the construction which permits a predetermined amount of water to be stored in the storing means included in the coating apparatus of the present invention.

In the embodiments described above, the spiral groove 140 was formed in the inner surface of each of the drain pipes 122a, 122b in the lower open end portions. However, it is also possible to form a spiral projection as shown in FIGS. 12 to 14 in place of the spiral groove 140. Specifically, FIG. 12 shows that a single spiral projection 146 is formed on the inner surface of the drain pipe 122a". As apparent from the drawing, the gas-liquid mixed stream introduced into the drain pipe 122a" flows along the spiral projection 146 to form an eddy current while flowing downward. FIG. 13 shows that two spiral projections 148a, 148b are formed along the inner surface of the drain pipe 122a'''. In this embodiment, formation of an eddy current of the gas-liquid mixed stream is further promoted by the presence of the two spiral projections 148a, 148b. In the embodiments shown in FIGS. 12 and 13, the spiral projections formed within the drain pipe extend continuously. However, it is not absolutely necessary for the spiral projection to extend continuously. For example, it is possible to arrange obliquely a plurality of projecting pieces 150a, 150b such that these projecting pieces may form portions of a spiral arrangement, as shown in FIG. 15. Of course, it is possible to generate an eddy current in the case of arranging the projecting pieces 150a, 150b as shown in FIG. 15 in place of forming a continuous spiral projection.

In the embodiment shown in FIGS. 2 and 3, the liquid surface sensors HH, H and L are used for electrically allowing a predetermined amount of the waste solution to be stored in the tanks 124a, 124b. However, it is also possible in the present invention to use a mechanical system as shown in FIG. 15 in place of the electrical system for allowing a predetermined amount of the waste solution 144 to be stored in these tanks. In the system shown in FIG. 15, a waste solution discharge port 150 extends upward within the tank 124a by a height L such that the waste solution 144 is prevented from being stored in the tank 124a in a height greater than the height L noted above. In the embodiment of FIG. 15, the waste solution discharge port 150 is covered with a lid 152 having the same construction as that of the lid 127a shown in FIG. 2. Of course, broken pieces of the semiconductor wafer W are prevented from entering the waste solution discharge system. It should be noted, however, that, in the system shown in FIG. 15, it is possible for the waste solution 144 stored in the tank 124a to be evaporated completely so as to make the tank 124a vacant. Therefore, where it is desired to keep the tank 124a loaded with a predetermined amount of a solution, it is necessary to mount separately an electrical or mechanical sensor. Such being the situation, it is desirable to use the system shown in FIG. 15 in a developing apparatus because the waste solution 144 stored in the tank 124a is relatively unlikely to be evaporated and solidified in this case.

The coating apparatus of the present invention is not limited to the preferred embodiments shown in the drawings. Needless to say, it is possible for those skilled in the art to modify the coating apparatus of the present invention disclosed herein in various fashions within the technical scope of the present invention. For example, the embodiments shown in the drawings are directed to a resist coating apparatus for a semiconductor wafer. However, the technical idea of the present invention can also be applied to an apparatus for coating, for example, an LCD substrate with a coating solution, or to a developing apparatus.

As described above, the present invention provides a coating apparatus comprising a drain cup for receiving droplets of a coating solution scattered from an object to be coated, e.g., a semiconductor wafer, during the coating operation. In the present invention, the waste solution received by the drain cup in the form of droplets forms a gas-liquid mixture. The waste solution is not separated into the gaseous component and the liquid component within the drain cup, and the gas-liquid mixed stream is guided through the common discharge means into a storing means so as to be separated into the waste solution and the exhaust gas by the gas-liquid separating means arranged in the storing means. It follows that the waste solution is prevented from being solidified within the drain cup and, thus, the waste solution outlet port of the drain cup is not plugged in the present invention. Also, a predetermined amount of the waste solution is kept stored in the storing means included in the coating apparatus of the present invention so as to eliminate the problem inherent in the conventional apparatus that the storing means tends to become vacant. It follows the gas-liquid mixed stream introduced into the storing means is allowed to collide against the surface of the waste solution stored in the storing means so as to remove effectively the mist included in the waste solution. It is also possible to prevent the waste solution from being solidified within the storing means.

It should also be noted that an exhaust gas damper is arranged in the exhaust gas discharge system for discharging the exhaust gas separated by the gas-liquid separating means. It follows that the exhaust gas discharge rate can be controlled by using an exhaust gas damper which is cheap and can be operated easily, making it possible not to use a costly flow rate control device such as a mass flow controller. For example, when the coating apparatus is not operated, the degree of opening of the exhaust gas damper is diminished so as to perform an exhaust gas discharge at a very low gas flow rate as far as the waste solution or solvent stored in the storing means is not solidified. It follows that, when the coating apparatus is not operated because of, for example, a long vacation, it is possible to prevent the waste solution or solvent from being evaporated within the storing means such that the resultant vapor stays within the storing means. Naturally, it is possible to prevent generation of an offensive odor and to suppress the danger of catching fire. Further, since the waste solution or solvent is not solidified even if an exhaust gas discharge operation is kept continued, the coating apparatus can be restarted promptly when desired without washing the apparatus.

What should also be noted is that, in controlling the exhaust gas discharge in the coating apparatus of the present invention, the degree of opening of the exhaust gas damper can be diminished at the stage of determining the thickness of the film coated on the surface of the object. It follows that it is possible to suppress the phenomenon that the coating solution positioned on the peripheral portion of the object is solidified faster than the coating solution positioned in the central portion by performing the ordinary exhaust gas discharge even at the stage of determining the film thickness as in the conventional apparatus. As a result, the coating apparatus of the present invention makes it possible to make the film coated on the object uniform in thickness over the entire region of the object.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A coating apparatus, comprising;

a container;

a rotatable support plate arranged within said container and movable in a vertical direction;

film forming means, coupled with said container, for supplying a predetermined coating solution onto a surface of an object disposed on said rotatable support plate, which is kept rotated, and for forming a coating film on the surface of said object;

discharge means, coupled with said container, for discharging the coating solution together with an exhaust gas from said container, said coating solution being scattered from the object and collected within said container;

storing means, coupled with said discharge means, for temporarily storing the waste solution coming from said discharge means;

gas-liquid separating means, coupled with said storing means, for separating the waste solution within said storing means into a waste solution and an exhaust gas; and storing amount control means, coupled with said storing means and including a discharge valve for the waste solution, said storing amount control means for detecting a level of the waste solution in said storing means and controlling a storing amount of the waste solution in said storing means by open or close operation of the discharge valve to permit a predetermined amount of the waste solution to be stored in said storing means.

2. The coating apparatus according to claim 1, wherein said discharge means comprises an opening positioned higher than the surface of the waste solution stored in a maximum amount in said storing means, and said gas-liquid separating means consists of an exhaust gas discharge port positioned higher than said opening of the discharge means and a waste solution discharge port positioned lower than said opening of the discharge means.

3. The coating apparatus according to claim 2, wherein said opening of the discharge means is tapered.

4. The coating apparatus according to claim 2, wherein at least a part of said opening of the discharge means is in contact with an inner surface of the storing means.

5. The coating apparatus according to claim 2, wherein said opening of the discharge means is provided with a piece connects at least a part of the opening with an inner surface of the storing means.

6. The coating apparatus according to claim 2, wherein said opening of the discharge means is provided with a strip piece extending to reach the surface of the waste solution and/or solvent stored in the storing means.

7. The coating apparatus according to claim 2, wherein said discharge means is provided with eddy current generating means for generating an eddy current in the vicinity of said opening of the discharge means.

8. A coating apparatus, comprising:

a container;

a rotatable support plate arranged within said container and movable in a vertical direction;

film forming means, coupled with said container, for supplying a predetermined coating solution onto a surface of an object disposed on said rotatable support plate, which is kept rotated, for forming a coating film on the surface of said object;

discharge means, coupled with said container, for discharging the coating solution together with an exhaust gas from said container, said coating solution being scattered from the object and collected within said container;

storing means, coupled with said discharge means, for temporarily storing the waste solution coming from said discharge means;

gas-liquid separating means, coupled with said storing means, for separating the waste solution within said storing means into a waste solution and an exhaust gas;

storing amount control means, coupled with said storing means, for controlling a storing amount of the waste solution to permit a predetermined amount of the waste solution to be stored in said storing means, and an exhaust gas damper arranged in an exhaust system for discharging the exhaust gas separated by the gas-liquid separating means, the discharge amount of the exhaust gas being controlled by controlling the degree of opening of the exhaust gas damper.

9. The coating apparatus according to claim 8, wherein said discharge means comprises an opening positioned higher than the surface of the waste solution stored in a maximum amount in said storing means, and said gas-liquid separating means consists of an exhaust gas discharge port positioned higher than said opening of the discharge means and a waste solution discharge port positioned lower than said opening of the discharge means.

10. The coating apparatus according to claim 9, wherein said opening of the discharge means is tapered.

11. The coating apparatus according to claim 9, wherein at least a part of said opening of the discharge means is in contact with an inner surface of the storing means.

12. The coating apparatus according to claim 9, wherein said opening of the discharge means is provided with a piece which connects at least a part of the opening with an inner surface of the storing means.

13. The coating apparatus according to claim 9, wherein said opening of the discharge means is provided with a strip piece extending to reach the surface of the waste solution and/or solvent stored in the storing means.

14. The coating apparatus according to claim 9, wherein said discharge means is provided with eddy current generating means for generating an eddy current in the vicinity of said opening of the discharge means.

* * * * *